(12) United States Patent
Ge

(10) Patent No.: US 7,158,761 B2
(45) Date of Patent: Jan. 2, 2007

(54) SMART AMPLIFIER FOR TIME DIVISION DUPLEX WIRELESS APPLICATIONS

(75) Inventor: David Ge, Potomac, MD (US)

(73) Assignee: Teletronics International, Inc., Rockville, MD (US)

( * ) Notice: Subject to any disclaimer, the term of this patent is extended or adjusted under 35 U.S.C. 154(b) by 361 days.

(21) Appl. No.: 10/743,754

(22) Filed: Dec. 24, 2003

(65) Prior Publication Data

US 2004/0137854 A1 Jul. 15, 2004

Related U.S. Application Data

(62) Division of application No. 09/524,745, filed on Mar. 14, 2000, now Pat. No. 6,681,100.

(60) Provisional application No. 60/124,365, filed on Mar. 15, 1999.

(51) Int. Cl.
*H04B 1/44* (2006.01)

(52) U.S. Cl. .................. 455/78; 455/127.2; 455/232.1

(58) Field of Classification Search .................. 455/78, 455/79, 82, 84, 127.1, 127.2, 232.1, 69, 522; 330/127, 278, 129, 136
See application file for complete search history.

(56) References Cited

U.S. PATENT DOCUMENTS

| | | | |
|---|---|---|---|
| 3,569,840 A | 3/1971 | Tanaka et al. | |
| 4,178,548 A | 12/1979 | Thompson | |
| 4,392,245 A | 7/1983 | Mitama | |
| 4,810,101 A | 3/1989 | Kage et al. | |
| 4,835,494 A | 5/1989 | Preschutti | |
| 4,849,963 A | 7/1989 | Kawano et al. | |
| 4,970,722 A | 11/1990 | Preschutti | |
| 5,208,550 A * | 5/1993 | Iwane | 330/129 |
| 5,212,814 A * | 5/1993 | Iwane | 455/107 |
| 5,291,147 A * | 3/1994 | Muurinen | 330/136 |
| 5,805,979 A | 9/1998 | Miyashita | |
| 5,867,769 A | 2/1999 | Ichiyanagi | |
| 5,918,164 A | 6/1999 | Takahashi et al. | |
| 6,011,980 A | 1/2000 | Nagano et al. | |
| 6,088,573 A | 7/2000 | Tsuda | |
| 6,198,830 B1 | 3/2001 | Holube et al. | |
| 2001/0023177 A1 | 9/2001 | Tanaka | |

OTHER PUBLICATIONS

"Smart Amplifier Remote Bi-Directional Power Amplifiers for 2.4 GHz User and Installation Manual", Teletronics International, Inc., 1998, p. 1-9, no month listed.
Model AMP2440 Remote Bi-Directional Power Amplifiers for 2.4 GHz User and Installation Manual, Young Design, Inc. Feb. 1998, vol. 1.4, p. 1-9.

* cited by examiner

*Primary Examiner*—Erika A. Gary
(74) *Attorney, Agent, or Firm*—Cahn & Samuels, LLP

(57) ABSTRACT

A bi-directional antenna-mount amplifier particularly suited to be compatible with a broad range of advanced spread spectrum TDD wireless applications relying on either direct sequence or frequency hopping, at a wide range of frequencies, and which allows the radio device sharing of an associated antenna in different time intervals, where signal distortion is minimized due to operation of the amplifier which is governed by an equation and associated gain control circuits to maintain constant output power and prevent transmit signal saturation.

7 Claims, 4 Drawing Sheets

RF POWER DETECTION AND GAIN CONTROL OPERATION

SCHEMATIC OF THE RF LEVEL DETECTION AND GAIN CONTROL CIRCUITS

SMART AMPLIFIER FOR TIME DIVISION DUPLEX WIRELESS APPLICATIONS

This application claims priority to Provisional Application Ser. No. 60/124,365 filed Mar. 15,1999 and is a divisional of application Ser. No. 09/524,745 filed Mar. 14, 2000, now U.S. Pat. No. 6,681,100.

BACKGROUND OF THE INVENTION

1. Technical Field

This invention relates to wireless applications using Time Division Duplex (TDD) technology in Wireless Local Area Network (WLAN), Wireless Local Loop (WLL), Wireless Internet Access (WIA), wireless modem connection with point-to-point and point-to-multipoint applications.

2. Description of the Related Art

Typically in wireless applications, adding on an antenna amplifier and DC injector is a purchaser option. However, when the operating range of wireless applications is long as, for example, between buildings on a campus, the inclusion of an add-on antenna amplifier/DC injector set may become necessary in order to preserve transmission quality. As is well known by persons in the art, every system presents its own set of considerations. For example, different site environments magnify the significant technical, architectural, and environmental differences between different hardware. In many such instances, the use of conventional amplifiers is limited and a single amplifier design cannot and does not have a sufficient useful range to meet many typical applications.

Attenuation between a DC injector and bi-directional amplifier can range from a few dB to more than 20 dB, losses which may be compounded further from substantial cable interconnection lengths running to hundreds of feet. Furthermore, output power from different radio modems vary which requires component matching in order to avoid undesirable additional losses. In view of such considerations, conventional amplifiers require the system installer to carefully evaluate and measure the input RF power at the antenna amplifier and specify the gain of the amplifier. Thus, in order to achieve and maintain acceptable system performance, conventional applications often require the use of different amplifiers with different systems to meet the specific ambient operating criteria. Failure to exercise careful installation and engage in proper maintenance can cause serious operational degradation.

SUMMARY OF THE INVENTION

Accordingly, it is an object of the present invention to overcome the problems associated with the prior art.

It is another object of this invention to provide an amplifier maximizing operational capabilities so as to be usable in a broad range of situations and adapted for use over a wide input power range.

A further object of this invention to provide an amplifier that is capable of flexible operational parameters so as to be usable with a broad range of hardware and in a broad range of operational environments Still another object of this invention is to provide a standardized amplifier structure which is economical to install and to maintain.

Yet another object of this invention is to provide an amplifier possessing self-adjusting transmit gain.

A further object of this invention is to provide an amplifier embodying an equation providing for self adjustment of amplifier transmission gain.

A further object of this invention is to maintain constant power levels and minimize signal distortion.

These and other objects are satisfied by a combination of an RF input, an RF power sensor to sense the power level of the RF input, an RF power level detector connected to the power sensor, a transmit gain control circuit connected to the level detector, a transmit chain/path and receive circuit and a plurality of transmit/receive switches for time division duplex operation connected to the transmit chain and receive circuit. Further, with respect to at least one embodiment of the invention, the receive circuit includes a bandpass filter and a low noise operational amplifier disposed between the transmit/receive switches.

Still other objects are satisfied by the method for maintaining substantially constant output from an RF amplifier independent of input power levels where the amplifier operates to produce $$P_{out} = C \cdot K \cdot 10^{VR} \cdot 10^{-B \cdot Log(P_{in})} \cdot P_{in} = C \cdot K \cdot 10^{VR+B}$$

where B and C are constants, K is the constant amplifier gain, VR is a fixed reference voltage, $P_{in}$ is the RF input power level, and $P_{out}$ is the output power.

The present invention, in short, provides for both power level detection and automatic gain control. The invention contemplates automatically (intelligently) adapting the gain to the input power level, cable, and connector loss due to the particular lengths and configuration of a set up. The invention is particularly useful in TDD wireless applications as the circuitry permits the output power level to be intelligently monitored and maintained whereby desired performance can be achieved regardless of the details of the particular TDD hardware configuration and/or installation environment.

The invention is particularly a cost effective solution for "last-mile" applications, e.g. connectivity between office buildings, for remote monitoring and in rural areas. Presently, the invention is designed for use with direct sequence or frequency hopping spread spectrum radio modems (or wireless equipment such as LAN cards) to boost transmit power amplification and receive signal gain. By including a dynamic power sensor in an amplifier constructed according to the invention, the RF power output level is adjusted by detecting the input signal power. This automatic gain adjustment minimizes distortion and maximizes output power regardless of variations in input levels.

By exploiting the automatic gain control technique of the invention, an antenna amplifier can detect the input power level, automatically adjust its gain, maintain the output power to a specified level, minimize the signal distortion, and maximize transmission distance. Moreover, standardization, simplicity, and low cost, give this invention an advantage over conventional, "non-intelligent" amplifier structures and methods, particularly as applied to TDD wireless applications.

As used herein "connected" includes physical, whether direct or indirect, hardwired or wireless, or any operationally functional connection.

As used herein "substantially" is a relative modifier intended to indicate permissible variation from the characteristic so modified. It is not intended to be limited to the absolute value or characteristic which it modifies but rather approaching or approximating such a physical or functional characteristic.

Given the following detailed description, it should become apparent to the person having ordinary skill in the art that the invention herein provides an antenna mountable, bi-directional amplifier designed to match advanced spread spectrum direct sequence or frequency hopping systems, and to permit extension of the operating range in wireless environment, at for example, frequencies of 900 MHz, 2.4 GHz, and 5.8 GHz (corresponding to current advanced spread spectrum system operational frequencies). In simplest terms the inventive amplifier herein embodies an intelligent algorithm, preferably, combined with Automatic Gain Controlled (AGC) circuits to maintain the output power and prevent transmit signal saturation. The gain automatically adjusts to minimize the signal distortion by sensing input power with an RF so that the desired signal quality can be assured. Moreover, because the invention utilizes TDD mode, it permits a radio device sharing in different time intervals of an antenna with which the amplifier is associated.

DESCRIPTION OF THE PRFFERRFD EMBODIMENT

Figure 1:
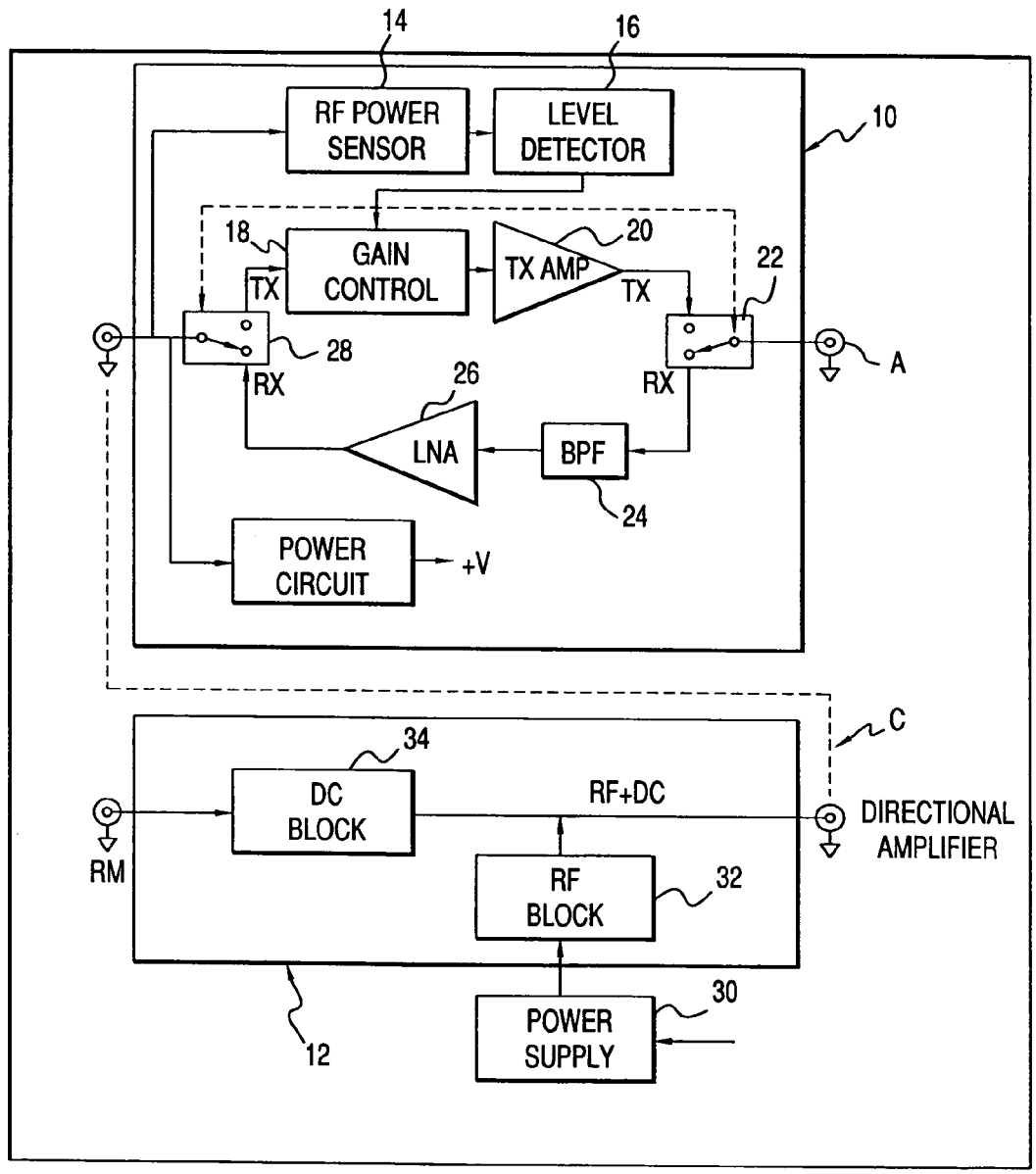
FIG. 1 is a functional block diagram of the illustrated embodiment of the invention.

As illustrated in functional block diagram FIG. 1, the invention comprises a bi-directional amplifier unit 10 connected to an antenna A and a DC Injector unit 12 via a bi-directional cable C (communicating RF signal and DC power to antenna amplifier) where the DC injector is connected to a wireless radio unit which for the purposes of illustration and not limitation is identified as a radio modem RM herein. The amplifier includes a power detection module comprising an RF power sensor 14 and a power level detector 16. The power level detector 16 connects to a variable attenuator gain control module 18, the output of which is fed to a transmitting amplifier 20 which in turn amplifies its output to a transmit/receive switch 22. The switch 22 operatively connects the amplifier unit to the RF antenna A and also toggles between a transmitting mode and receiving mode. When in a receiving mode, the switch directs the antenna input to a bandpass filter 24 followed by a low-noise amplifier 26. The output of the low noise amplifier 26 is directed to a second transmit/receive switch 28. The switch 28 toggles between outputting to the gain control module 18 when in the transmit mode, and the DC injector 12.

The DC injector 12 which is operatively connected via cable C to bi-directional amplifier unit 10, includes an AC power supply input 30 and a RF blocking filter 32 that are connected to the cable input/output from the bi-directional amplifier unit 10 to provide a signal boost. That same pathway includes a further connection to a DC blocking filter 34 and the target radio modem RM.

Figure 2:
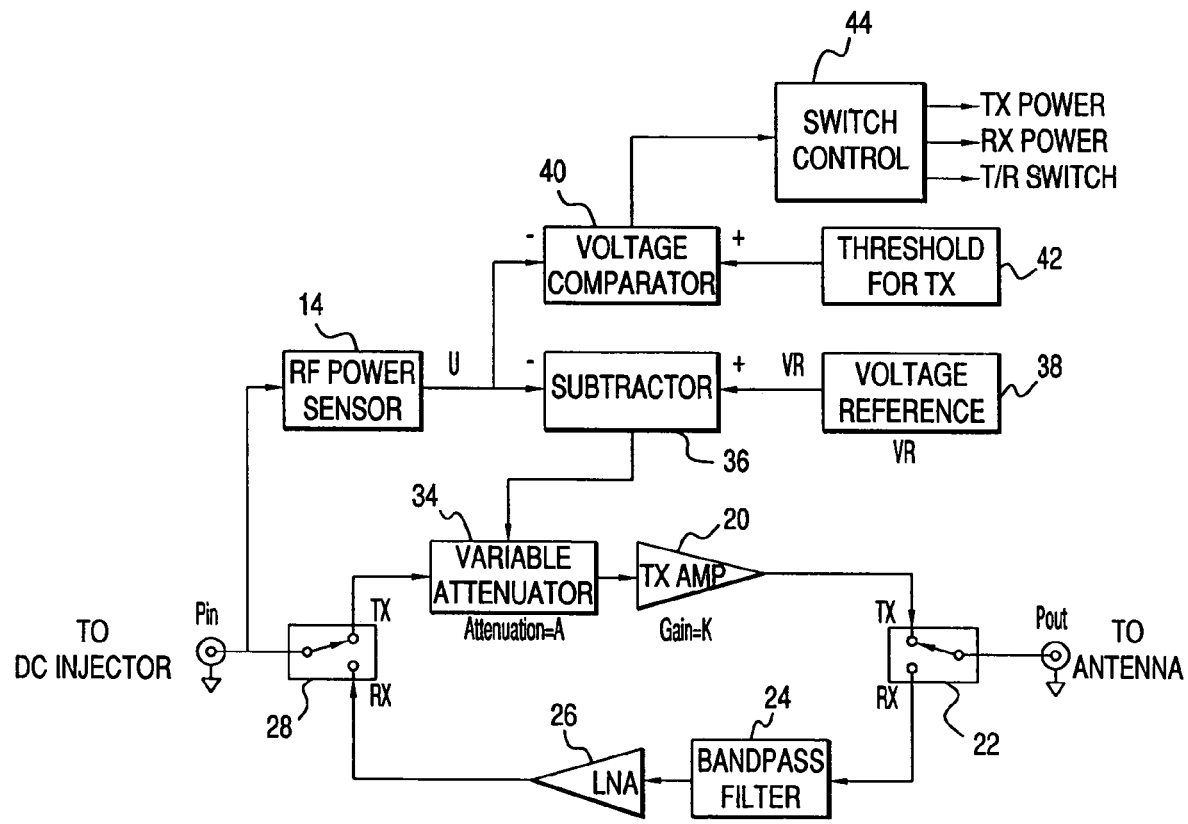
FIG. 2 is a block diagram of the RF level detection and gain control operation of the illustrated embodiment of the invention.

FIG. 2 is a more detailed functional block diagram of the power detection and gain control block diagram. The gain control circuit 18 includes a variable attenuator 34 that is provided an input from a subtractor 36. The subtractor 36 has two inputs, one from the power sensor 14 designated U and the other from reference voltage source 38 designated VR. The subtractor identifies the voltage variation from the established reference voltage VR of the voltage of the input RF power from the sensor 14. A voltage comparator 40 is also connected to the RF voltage output from the power source 14. The voltage comparator 40 provides an output to a switch controller 44 which signals the transmit/receive switches 22 and 28 to switch between the transmit and receive modes depending on the output voltage. That voltage is determined by the comparison of an established transmission voltage threshold provided by element 42 and the sensed power input U from power sensor 14. The amplifier unit 10 thereby switches from transmit to receive mode automatically when the RF power is below the threshold level.

The functionality of the unit represented by the block diagram is resolvable and understood by the following algorithmic treatment.

Where RF power sensor and level detector output is designated U, the characteristic of the RF power sensor can be described as follows:

$$U = B \cdot \text{Log}(P_{in}) \tag{1}$$

where B is a constant and $P_{in}$ is the input RF power level. The output power $P_{out}$ is definable as:

$$P_{out} = A \cdot K \cdot P_{in} \tag{2}$$

where A is the gain of the attenuator, which is the function of its control voltage and K is the constant gain of the amplifier.

The RF sensor controls the variable attenuator according to the following equation:

$$A = C \cdot 10^{(VR-U)} = C \cdot 10^{(VR - B \cdot \text{Log}(P_{in}))} \tag{3}$$

where C is another constant.

Substituting equation 2 with equation 3 produces:

$$P_{out} = C \cdot K \cdot 10^{VR} \cdot 10^{-B \cdot \text{Log}(P_{in})} \cdot P_{in} = C \cdot K \cdot 10^{VR+B} \tag{4}$$

The voltage reference output is constant, e.g., a fixed reference voltage. Because it does not change, the final output $P_{out}$, under the foregoing, remains constant. It is this functionality upon which the invention is based; the amplifier remains at predetermined output power level regardless the RF input power level $P_{in}$. In addition to the hardwired, hardware format of illustrated embodiment, this equation may be implemented via software, by permanent incorporation into an application specific integrated circuit (ASIC), or subject to a masking procedure in the case of large scale mass production.

Figure 3:
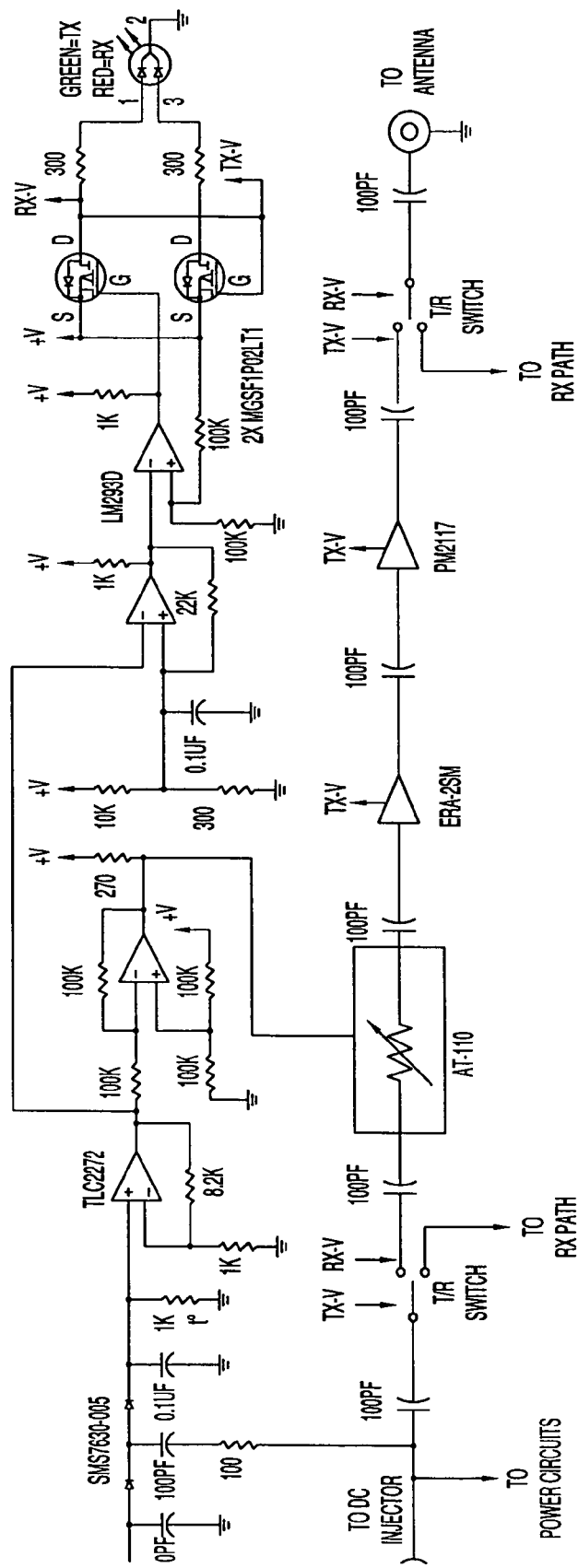
FIG. 3 is the schematic of the RF level detection and gain control circuits of the illustrated embodiment of the invention.

A schematic disclosing specific circuitry for achieving the invention herein is detailed in FIG. 3. The specifics of the schematic are not intended to be limiting but only illustrative of one embodiment of the invention.

In its current embodiments, amplifiers according to the present invention are available at three frequency ranges; 900 MHz, 2.4 GHz, and 5.8 GHz. The invention is not limited to these ranges which represent authorized RF transmission frequencies. The following tables provide performance and specifications for the presently available commercial amplifiers according to the invention at the foregoing operational frequencies:

|  | 900 MHz | 2.4 GHz | 5.8 GHz |
|---|---|---|---|
| Operating Range | 902–928 MHz | 2400–2500 MHz | 5725–5875 MHz |
| Operating Mode | Bi-directional, half-duplex Time Division Duplex. Senses RF carrier from transmitter and automatically switches from receive to transmit mode | | |
| Transmit Gain | 26 dB max.(automatically adjusted) | | 17 dB max. |
| Frequency Response | ±1 dB over operating range | | |
| Output Power | 4 Watts (+36 dBm) nominal | 500 mW (+27 dBm) nominal | 1.0 W (+30 dBm) nominal |
| TX Input Power | 10 mW (10 dBm) minimum, up to 500 mW(+27 dBm) max | 1 mW (0 dBm) minimum, up to 200 mW (+23 dBm) maximum | 0.5 mW (−3 dBm) minimum, up to 25 mW (+14 dBm) maximum |
| Receiver Gain | 24 dB typical | 14 dB typical | 10 dB typical |
| Noise Figure | | 3.5 dB typical | |
| Power Consumption from power supply | 1.7 A @ 12 V DC or 105–240 V AC | 650 mA @ 12 V DC or 105–240 V AC | 1.7 A @ 12 V DC or 105–240 V AC |
| Operating Temp. Bi-directional Amp. | | −20° C. to +70° C. | |
| Operating Temp. 12 V DC Injector | | −30° C. to +70° C. | |
| Humidity Bi-directional Amp. | | up to 100% Relative Humidity | |
| Humidity 12 V DC Injector | | 10% to 75% Relative Humidity | |

The foregoing operational table demonstrates that the present invention is ideal to increase the range of low power devices like LAN cards, low power radio modems and to recover the cable losses resulting from installation. The foregoing example of a 900 MHz unit in accordance with the invention is capable of full output power of substantially constant 4 Watts from as little as a 10 mW input. The 2.4 Gz version, described above, is capable of providing a substantially constant 500 mW output from only a 2 mW input.

Figure 4:
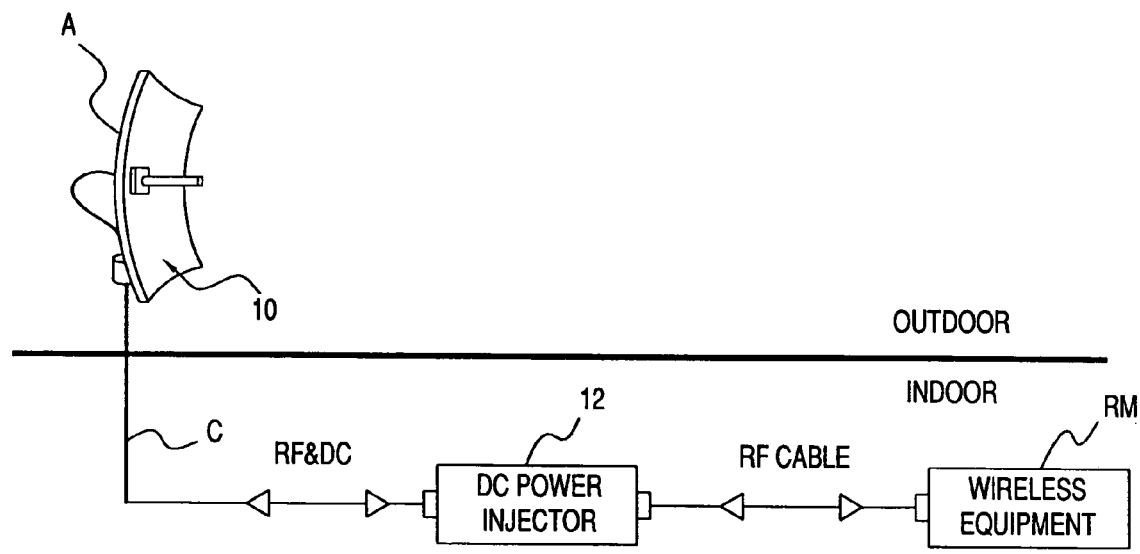
FIG. 4 is a schematic view of a typical installation of the invention.

Turning now to FIG. 4, a typical installation depicts the amplifier unit 10 mounted with U-bolts to the pole of antenna A on the exterior of a building. Bi-directional cable C communicates signals between amplifier unit 10 and DC injector 12 which is typically located in a protected environment, e.g., in a shelter or inside the building, but proximate to the radio modem RM or other wireless RF equipment.

Figure 5:
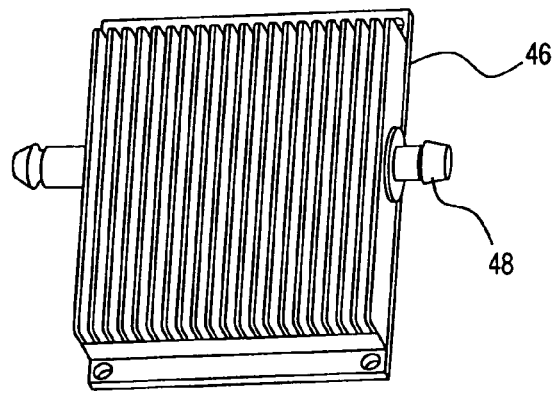
FIG. 5 is a perspective view of the illustrated embodiment of an amplifier constructed in accordance with the invention.

In FIG. 5, an exemplary housing 46 for the amplifier unit 10 is depicted. Preferably, the housing 46 for the amplifier unit 10 should be small to provide for direct mounting on an antenna A, and also possess sufficient strength and ruggedness to survive in the environment in which it is installed. The housing depicted herein is formed from cast aluminum and features fins promoting heat dissipation. Notably, the particular configuration of the heat dissipation fins are a matter of design choice. The inputs include N-type, male, 50 Ohm connectors adapted for quick connection to standard commercially available N-type, female, 50 Ohm connectors disposed on the connecting cables.

From a performance perspective, the housing should be waterproof and provide for proper operation over a wide range of temperatures and humidity. In typical North American installations, the operational temperature range should extend from sub-zero arctic temperatures to near tropical temperature maximums. Likewise, the invention contemplates full functionality at a full range of humidities. Correspondingly, the invention preferably incorporates protective features such as lighting protection circuitry and power surge protective circuitry to prevent damage from operational or environmental anomalies.

The invention allows the radio device sharing of an associated antenna in different time intervals as well as preventing transmit signal saturation.

Given the foregoing, it should be apparent that the specific described embodiments are illustrative and not intended to be limiting. Furthermore, variations and modifications to the invention should now be apparent to a person having ordinary skill in the art. These variations and modifications are intended to fall within the scope and spirit of the invention as defined by the following claims.

I claim:

1. An RF amplifier, comprising:
   an RF input;
   an RF power sensor to sense the power level of the RF input;
   an RF power level detector connected to said power sensor;
   a transmit gain control circuit connected to said level detector;
   a transmit chain/path and receive circuit; and
   a plurality of transmit/Receive switches for time division duplex operation connected to said transmit chain and receive circuit.

2. An RF amplifier. comprising:
   an RF input;
   an RF power sensor to sense the power level of the RF input;
   an RF power level detector connected to said power sensor;
   a transmit clam control circuit connected to said level detector;
   a transmit chain/path and receive circuit; and
   a plurality of transmit/Receive switches for time division duplex operation connected to said transmit chain and receive circuit;

wherein the receive circuit includes a bandpass filter and a low noise op amplifier disposed between said transmit/receive switches.

3. The RF amplifier of claim 2 where there are two transmit/receive switches.

4. An amplifier feedback circuit comprising;
an RF energy input means for inputting RF energy into the amplifier feedback circuit;
means for detection of said RF energy including the power level thereof;
means for comparing said RF power level with an established threshold;
means for controlling output gain of said RF power level;
means for switching between transmitting and receiving power said switch means being operatively connected in a loop with said means for controlling output gain and a filter.

5. A method for maintaining substantially constant output from an RF amplifier independent of input power levels where the amplifier operates according to the equation $$P_{out} = C \cdot K \cdot 10^{VR} \cdot 10^{-B \cdot Log\,(P_{in})} \cdot P_{in} = C \cdot K 10^{VR+B}$$

where B and C are constants, K is the constant amplifier gain, VR is a fixed reference voltage, $P_{in}$ is the RF input power level, and $P_{out}$ is the output power.

6. A method of maintaining substantially constant output power of an amplifier including an amplifier feedback circuit comprising an RF energy input means for inputting RF energy into the amplifier feedback circuit; means for detection of said RF energy including the power level thereof; means for comparing said RF power level with an established threshold; means for controlling output pain of said RF power level; means for switching between transmitting and receiving power said switch means being operatively connected in a loon with said means for controlling output pain and a filter, the method comprising the step of operating the amplifier feedback circuit according to the equation $$P_{out} = C \cdot K \cdot 10^{VR} \cdot 10^{-B \cdot Log\,(P_{in})} \cdot P_{in} = C \cdot K 10^{VR+B}$$

where B and C are constants, K is the constant amplifier gain, VR is a fixed reference voltage, $P_{in}$ is the RF input power level, and $P_{out}$ is the output power.

7. An RF amplifier, comprising;
an RF input port for receiving a transmit RF input signal;
an RF level detector for detecting a power level of the transmit RF input signal;
an amplifier circuit operable to amplify the transmit RF input signal into a transmit RF output signal;
a transmit gain control circuit operable to receive a level detection signal from said RF level detector and control an amount of amplification performed by said amplifier circuit based on the level detection signal;
an RF output port operable to transmit the transmit RF output signal and further operable to receive a receive RF input signal;
a receive circuit operable to receive the receive RF input signal from said RF output port; and
a switch operable to connect said amplifier circuit to said RF output port when the RF amplifier is in a transmit mode and connect said RF output port to said receive circuit when the RF amplifier is in a receive mode.

* * * * *